(12) United States Patent
Fujiwara et al.

(10) Patent No.: US 11,556,040 B2
(45) Date of Patent: Jan. 17, 2023

(54) SEMICONDUCTOR DEVICE

(71) Applicant: Nippon Telegraph and Telephone Corporation, Tokyo (JP)

(72) Inventors: Naoki Fujiwara, Musashino (JP); Yuta Ueda, Musashino (JP); Takahiko Shindo, Musashino (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 145 days.

(21) Appl. No.: 17/054,010

(22) PCT Filed: Apr. 18, 2019

(86) PCT No.: PCT/JP2019/016593
§ 371 (c)(1),
(2) Date: Nov. 9, 2020

(87) PCT Pub. No.: WO2019/216153
PCT Pub. Date: Nov. 14, 2019

(65) Prior Publication Data
US 2021/0157210 A1    May 27, 2021

(30) Foreign Application Priority Data

May 11, 2018 (JP) .............................. JP2018-092542

(51) Int. Cl.
*G02F 1/21* (2006.01)
*H01S 5/042* (2006.01)

(52) U.S. Cl.
CPC .............. *G02F 1/218* (2013.01); *G02F 1/212* (2021.01); *H01S 5/0427* (2013.01); *H01S 5/04256* (2019.08)

(58) Field of Classification Search
CPC .................................................. G02F 1/01708
(Continued)

(56) References Cited

U.S. PATENT DOCUMENTS

2002/0071621 A1    6/2002   Yamada

FOREIGN PATENT DOCUMENTS

JP    H07-49473 A    2/1995
JP    2002-174801 A    6/2002
(Continued)

OTHER PUBLICATIONS

International Search Report dated Jun. 18, 2019, issued in PCT Application No. PCT/JP2019/016593, filed Apr. 18, 2019.
(Continued)

*Primary Examiner* — Tuan N Nguyen
(74) *Attorney, Agent, or Firm* — Workman Nydegger

(57) ABSTRACT

A semiconductor device includes an electrode which is arranged on an organic material with an insulation film interposed therebetween and which does not easily peel away from the organic material along with the insulation film. An insulation film in a region including pad portions of a phase shift electrode and a modulation electrode has openings at the centers of the pad portions of the phase shift electrode and the modulation electrode, the edge portions of which are formed on the phase shift electrode and the modulation electrode. In this way, the adjoining edges of the phase shift electrode and modulation electrode and the insulation film are all covered by the insulation film so as not to be exposed to the atmosphere. By covering the cracks that occur in the insulation film in the production process with the insulation film made of $SiO_2$, $SiN_X$, $SiON_X$ or the like, an organic solvent such as acetone or ethanol used in the process can be prevented from seeping in between the insulation film and the organic material through the cracks in the insulation film.

19 Claims, 10 Drawing Sheets

(58) Field of Classification Search
USPC .................................................. 372/38.05
See application file for complete search history.

(56) References Cited

FOREIGN PATENT DOCUMENTS

| JP | 2008-235519 A | 10/2008 | | |
| JP | 2010-237296 A | 10/2010 | | |
| JP | 2013-021139 | * | 7/2011 | ............. H01S 5/026 |
| JP | 2013-21139 A | 1/2013 | | |

OTHER PUBLICATIONS

Y. Ueda et al., *Very-Low-Voltage Operation of Mach-Zehnder Interferometer-Type Electroabsorption Modulator Using Asymmetric Couplers*, Optics Express, vol. 22, No. 12, Jun. 16, 2014, pp. 1-7.

* cited by examiner

SEMICONDUCTOR DEVICE

TECHNICAL FIELD

The present invention relates to semiconductor devices, and more specifically to a semiconductor device with an improved production yield.

BACKGROUND ART

As transfer speeds in optical communication networks are increasing, progress is underway to realize semiconductor lasers and optical modulators that convert high-speed electric signals into optical signals.

For example, Non-patent Literature 1 discloses a Mach-Zehnder (MZ) interferometer-type electroabsorption modulator, which enables low voltage driving by incorporating an electroabsorption (EA) layer into an MZ interferometer and simultaneously using light absorption of the electroabsorption layer and the interference corresponding to the phase difference caused by the MZ interferometer. Specifically, high-speed driving of 25.8 Gbit/s becomes possible at a low voltage of 0.2 V, which makes it possible to reduce power consumption, and therefore makes it possible to perform driving with an inexpensive CMOS driver.

In addition, by directly modulating a distributed feedback (DFB) laser, it is possible to transmit modulated light with a simple configuration.

Semiconductor optical devices that perform modulation using high-speed electric signals may, in order to reduce capacitance and facilitate introduction of electric signals into the semiconductor device, have a construction in which an organic material with low capacitance and low dielectric constant is embedded on the chip and an electrode is arranged on the organic material with an insulation film interposed therebetween.

CITATION LIST

Non-Patent Literature

Non-Patent Literature 1: Y. Ueda et al., "Very-low-voltage operation of Mach-Zehnder interferometer-type electroabsorption modulator using asymmetric couplers", OPTICS EXPRESS 14610 (2014)

SUMMARY OF THE INVENTION

Technical Problem

However, since microcracks occur in the insulation film on the organic material at the time of production, the organic solvent used in the final stage of the production process of the semiconductor device may seep in between the organic material and the insulation film, which makes the adhesion between the organic material and the insulation film brittle. As a result, the insulation film and the electrode tend to peel away, and there is thus a problem in that electrode peeling can easily occur at the time of wire bonding, greatly reducing the yield.

The present invention was made in view of such problems, and an object thereof is to provide a semiconductor device including an electrode which is arranged on an organic material with an insulation film interposed therebetween and which does not easily peel away from the organic material along with the insulation film.

Means for Solving the Problem

In order to solve the above problem, an aspect of the present invention is a semiconductor device including a first insulation film in contact with an organic material embedded in the semiconductor device, an electrode formed on the first insulation film, and a second insulation film that covers the adjoining edges of the electrode and the first insulation film and has an opening that exposes a portion of the electrode.

According to another aspect of the present invention, the electrode is provided across the organic material and the semiconductor material of the semiconductor device.

According to another aspect of the present invention, the semiconductor device is a directly modulated semiconductor laser.

According to another aspect of the present invention, the semiconductor device is further a Mach-Zehnder modulator.

According to another aspect of the present invention, the Mach-Zehnder modulator further includes an electroabsorption modulator.

According to another aspect of the present invention, the organic material is further a polyamide or benzocyclobutene.

According to another aspect of the present invention, the second insulation film is further any of $SiO_2$, $SiN_X$, and $SiON_X$.

Effects of the Invention

According to the semiconductor device according to the present invention, the edge of the electrode formed on the semiconductor device is covered by an insulation film, and the insulation film on the organic material is not exposed to the atmosphere. Therefore, the organic solvent used in the production process will not seep through the microcracks in the insulation film on the organic material and come between the insulation film and the organic material, so that the insulation film does not easily peel away from the organic material, and consequently electrode peeling is less likely to occur. In other words, even though the device has a construction of an organic material with a low dielectric constant being inserted under an electrode, it is possible to suppress a reduction in breaking strength with respect to external forces and improve production yield.

DESCRIPTION OF EMBODIMENTS

The embodiments of the present invention are described in detail below.

First Embodiment

A semiconductor device according to a first embodiment of the present invention is an EA-MZ modulator that incorporates an EA modulator into an MZ interferometer and simultaneously uses light absorption of an EA layer and interference corresponding to a phase difference caused by the MZ interferometer. Underneath (on the substrate side of) the electrode which handles high-frequency electric signals, there is embedded benzocyclobutene, which is an organic material with a low capacitance, with an insulation film interposed therebetween. It should be noted that a similar capacitance reduction is also possible using a polyamide instead of benzocyclobutene.

Figure 1:
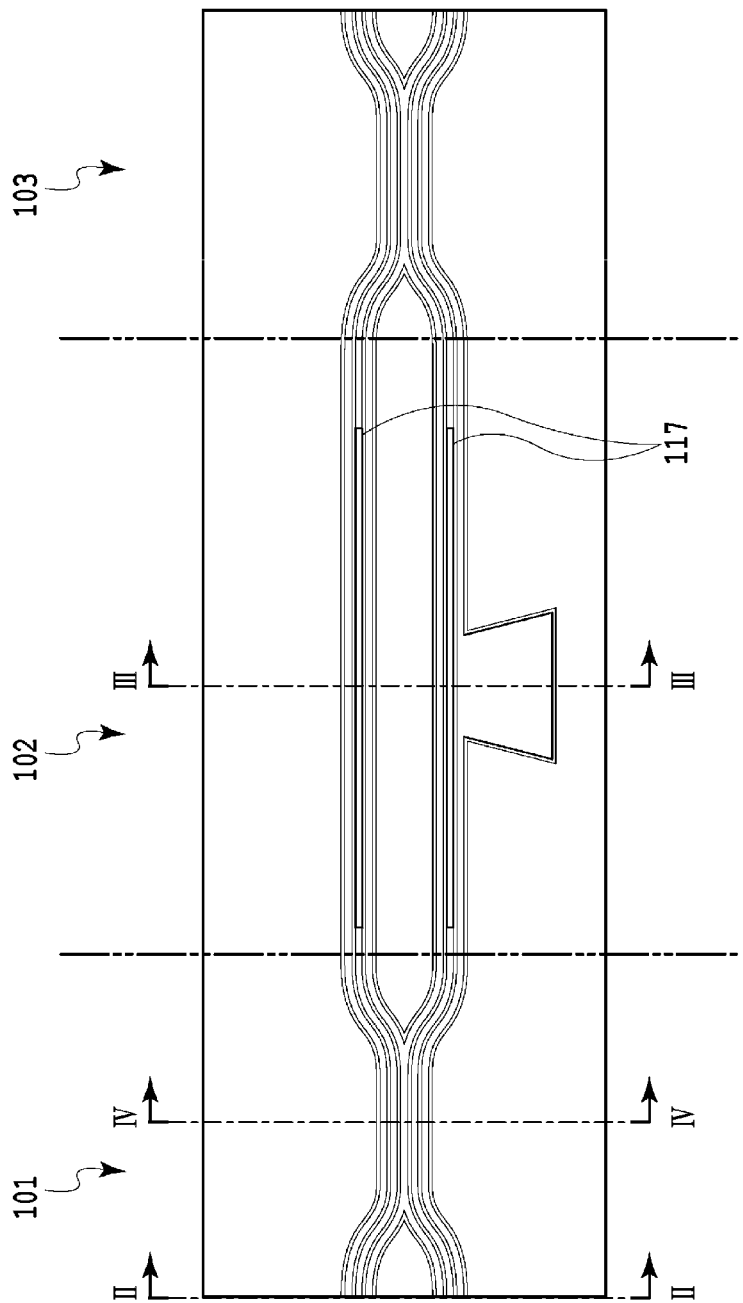
FIG. 1 is a top view of an EA-MZ modulator according to a first embodiment of the present invention before the electrode has been formed.
Figure 2:
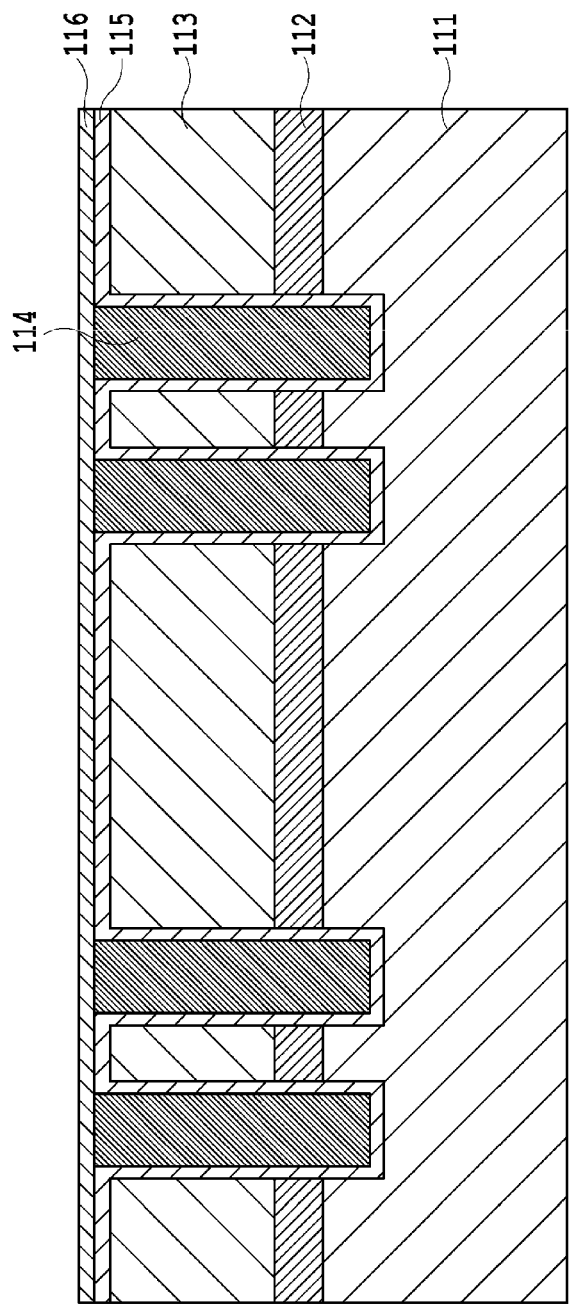
FIG. 2 is a cross-sectional view taken along line II-II of FIG. 1.
Figure 3:
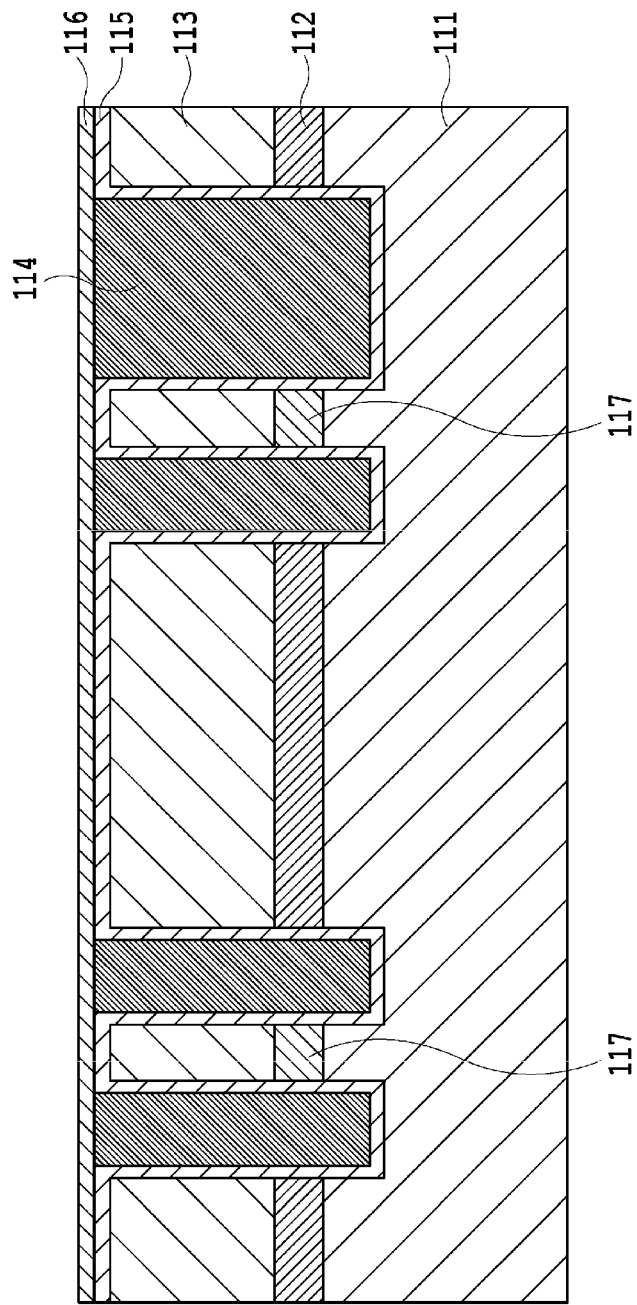
FIG. 3 is a cross-sectional view taken along line III-III of FIG. 1.
Figure 4:
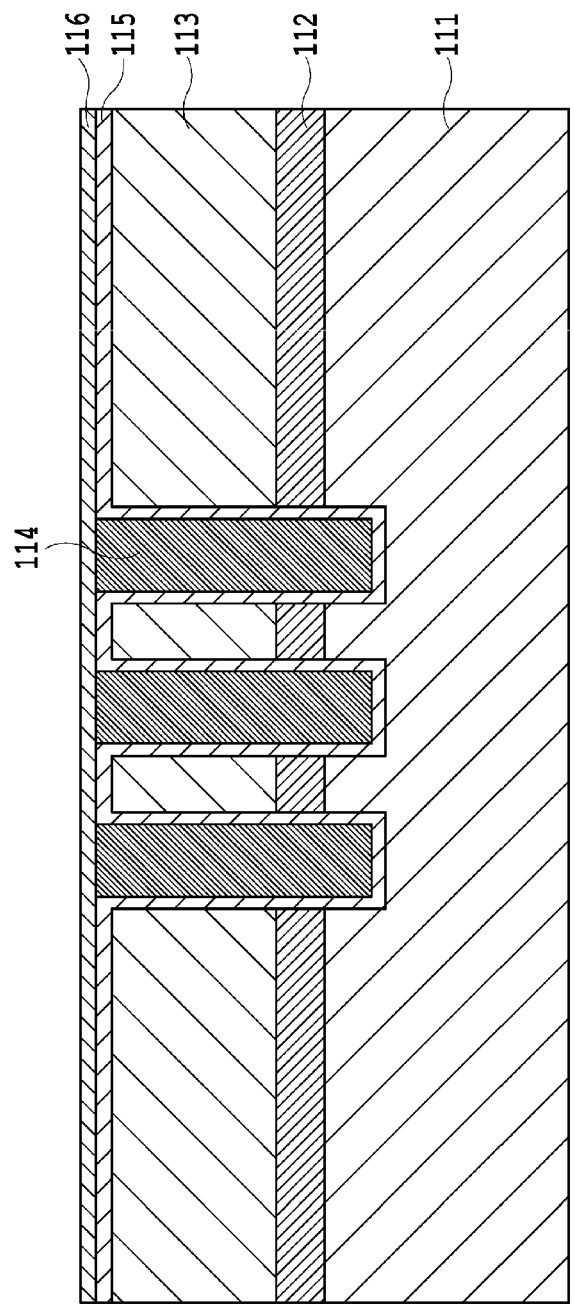
FIG. 4 is a cross-sectional view taken along line IV-IV of FIG. 1.

FIG. 1 shows a top view of the EA-MZ modulator according to the first embodiment of the present invention before the electrode has been formed. In addition, FIGS. 2, 3, and 4 respectively show cross-sectional views taken along lines II-II, III-III, and IV-IV of FIG. 1. It should be noted that in FIG. 1, the insulation film 116 shown in FIGS. 2 to 4 is not shown for the sake of convenience.

As shown in FIG. 1, the EA-MZ modulator is composed of a first multiplexing/demultiplexing unit 101, a modulation and phase shift unit 102, and a second multiplexing/demultiplexing unit 103. In the state before the electrode is formed shown in FIG. 1, a lower cladding layer 111, a passive layer 112, an EA layer 117, and an upper cladding layer 113 are stacked in order, both sides of regions that will constitute the cores of two waveguides are etched, and an insulation film 115 is formed on a surface thereof. Further, an organic material 114 is embedded on both sides of a portion constituting the core of the passive layer 112 and on both sides of the EA layer 117 with the insulation film 115 interposed therebetween. As shown in FIGS. 2 to 4, an insulation film 116 is further stacked on the organic material 114 and the insulation film 115.

Since the passive layer 112 including the cores of the optical waveguides of the first multiplexing/demultiplexing unit 101 and the second multiplexing/demultiplexing unit 103 is required to have sufficiently low optical loss, it was made of a composition having a photoluminescence (PL) peak at a considerably shorter wavelength than the modulated light (the PL peak being at a wavelength at least 200 nm shorter).

In addition, the EA layer 117 which constitutes the core of the optical waveguide of the modulation and phase shift unit 102 is made with a multi quantum well (MQW) construction.

Figure 5:
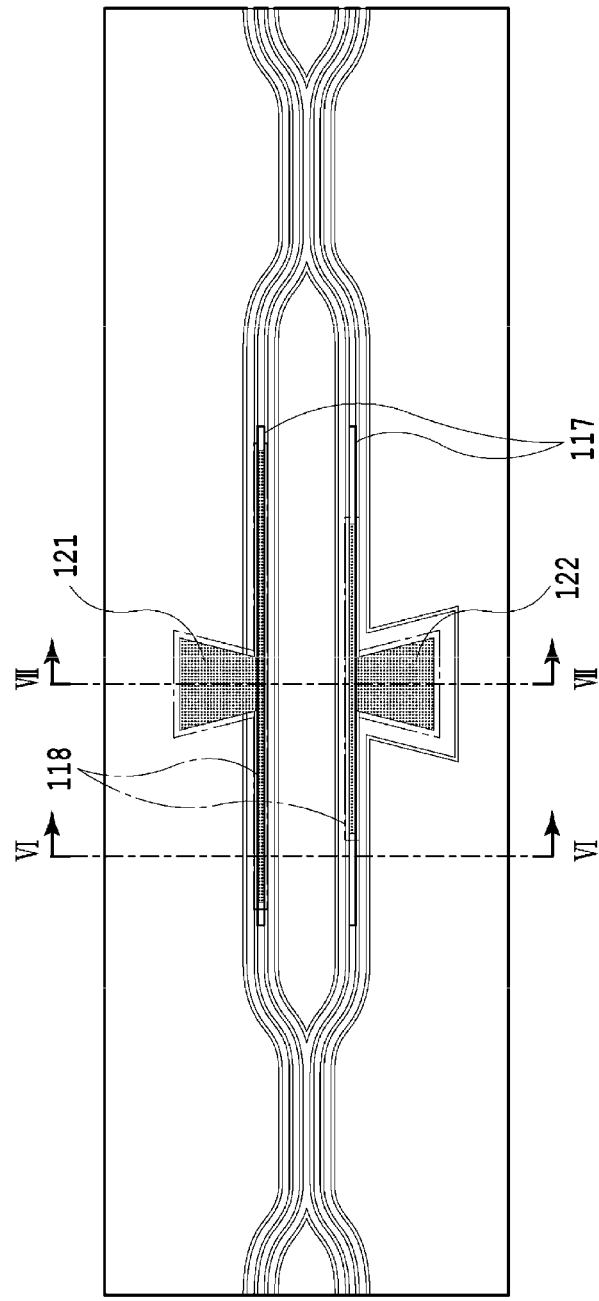
FIG. 5 is a top view of the EA-MZ modulator according to the first embodiment of the present invention after the electrode has been formed.

Next, FIG. 5 shows a top view of the EA-MZ modulator according to the first embodiment of the present invention after the electrode has been formed. In addition, FIGS. 6 and 7 respectively show cross-sectional views taken along lines VI-VI and VII-VII of FIG. 5. It should be noted that in FIG. 5, the insulation film 118 shown in FIGS. 6 and 7 is not shown for the sake of convenience.

As shown in FIG. 5, a phase shift electrode 121 and a modulation electrode 122 are formed in the region of the modulation and phase shift unit 102. The phase shift electrode 121 and the modulation electrode 122 consist of a portion formed on the upper cladding layer 113 of the EA layer 117 and a portion constituting a pad for connecting a wire. The entirety of the pad portion of the modulation electrode 122 is formed on the organic material 114 with the insulation film 116 interposed therebetween. In addition, as shown in FIGS. 6 and 7, a back electrode 123 is formed on the lower cladding layer 111.

Figure 6:
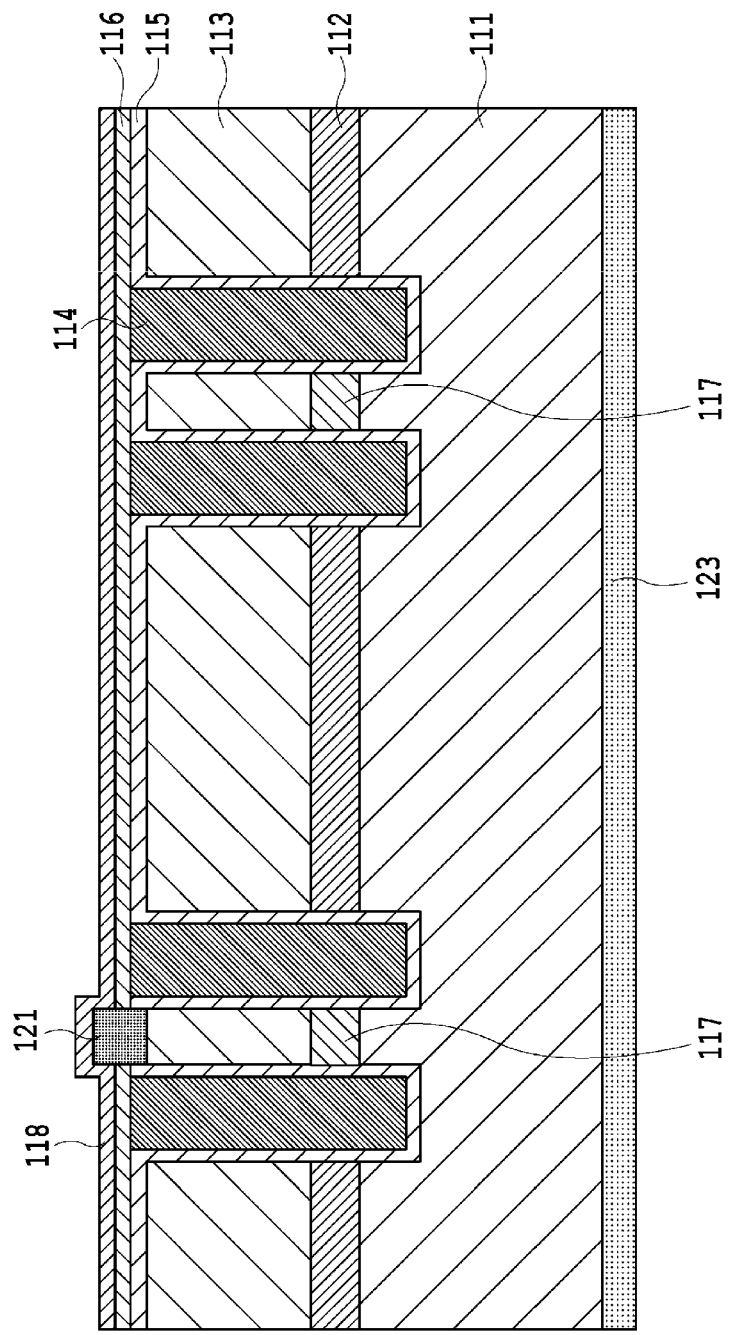
FIG. 6 is a cross-sectional view taken along line VI-VI of FIG. 5.

As shown in FIG. 6, the insulation film 118 in a region in which the phase shift electrode 121 and the modulation electrode 122 are formed only on the core, is formed so as to cover the entire surface of the device, including the phase shift electrode 121 and the modulation electrode 122.

Figure 7:
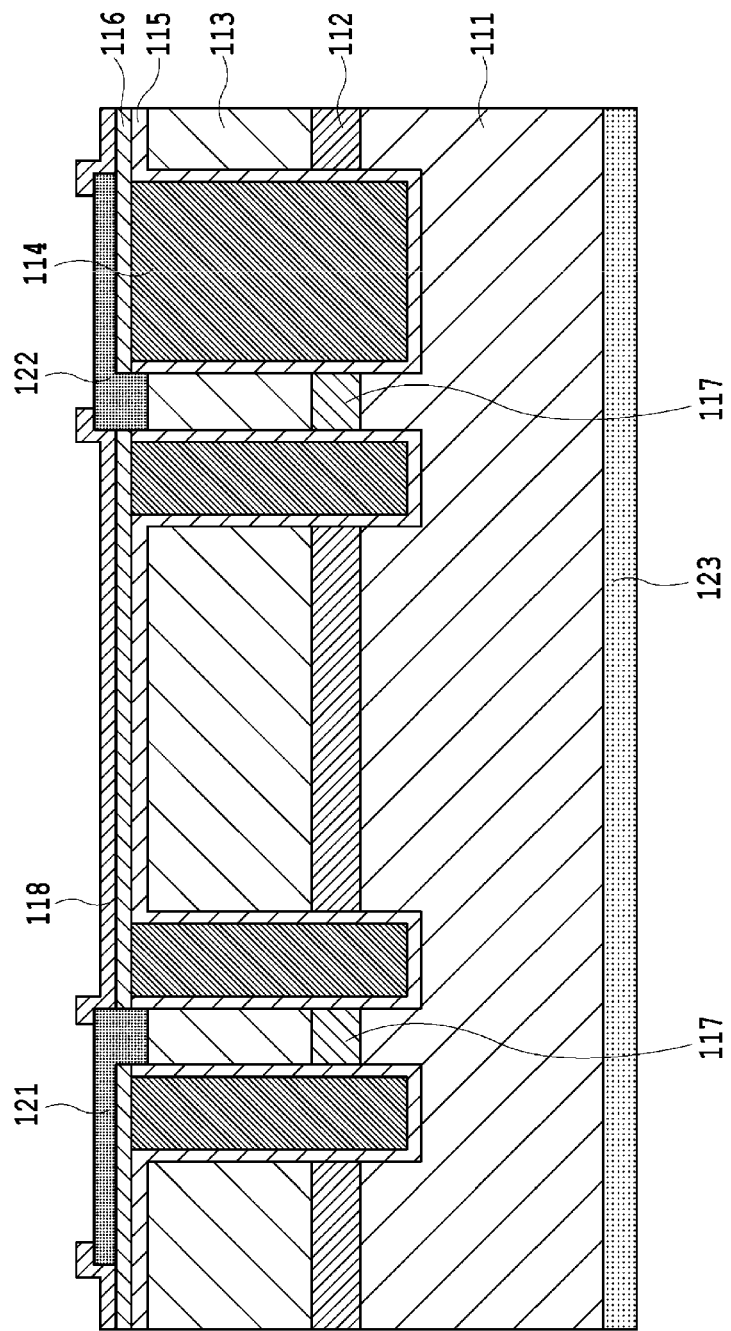
FIG. 7 is a cross-sectional view taken along line VII-VII of FIG. 5.

Meanwhile, as shown in FIG. 7, the insulation film 118 in a region including the pad portions of the phase shift electrode 121 and the modulation electrode 122 has openings at the centers of the pad portions of the phase shift electrode 121 and the modulation electrode 122, with edge portions of the openings also being formed on the phase shift electrode 121 and the modulation electrode 122.

In this way, in the EA-MZ modulator according to the first embodiment of the present invention, the adjoining edges of the phase shift electrode 121 and modulation electrode 122 and the insulation film 116 are covered by the insulation film 118 so as not to be exposed to the atmosphere. By covering the cracks that occur in the insulation film 116 in the production process with the insulation film 118 made of $SiO_2$, $SiN_X$, $SiON_X$ or the like, the organic solvent such as acetone or ethanol used in the process can be prevented from seeping in between the insulation film 116 and the organic material 114 through the cracks in the insulation film 116.

The effects of the insulation film 118 do not change whether it is made from $SiO_2$, $SiN_X$, or $SiON_X$. This prevented peeling at the interface of the embedded organic material 114 and the insulation film 116 at the time of wire bonding, and thus no peeling of the phase shift electrode 121 and the modulation electrode 122 occurred either. In a pull test, a strength of 6 g was achieved in a neck break mode.

Second Embodiment

Figure 8:
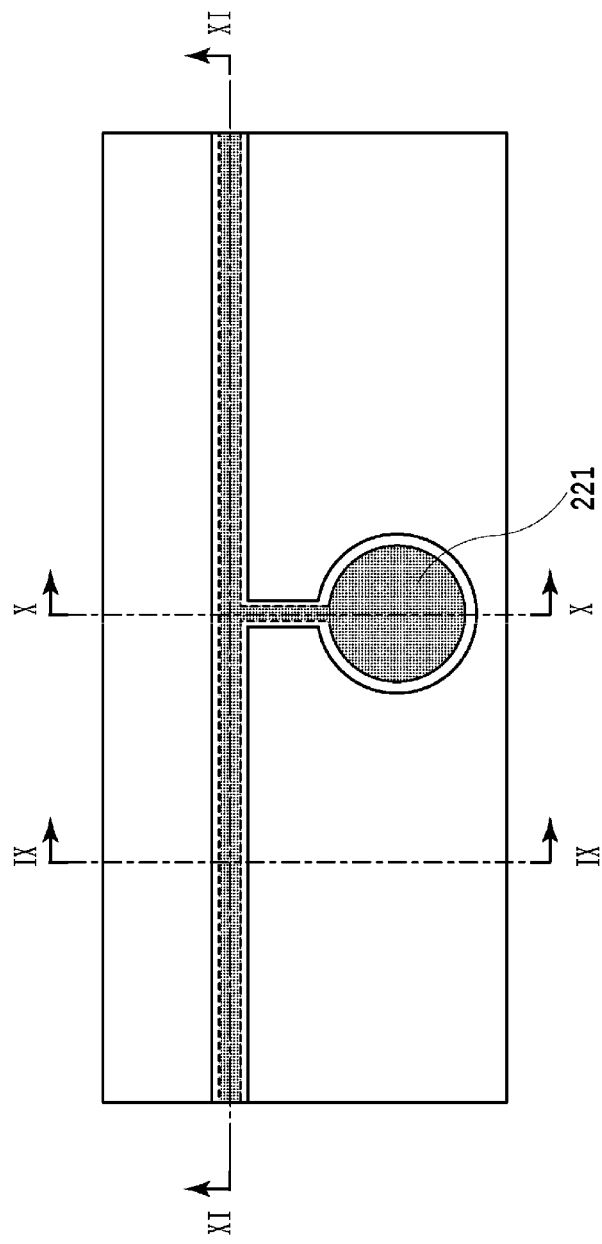
FIG. 8 is a top view of a directly modulated DFB laser according to a second embodiment of the present invention.
Figure 9:
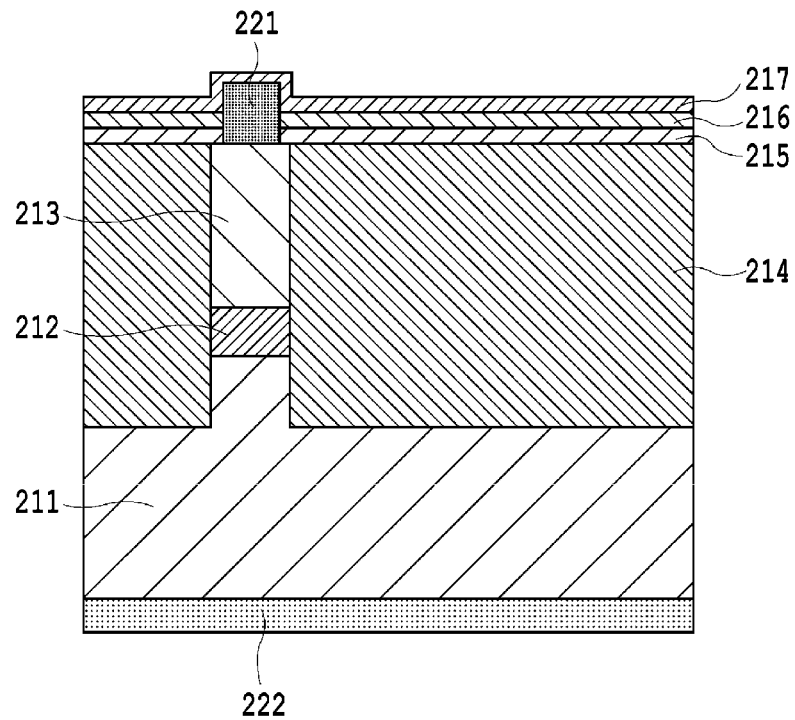
FIG. 9 is a cross-sectional view taken along line IX-IX of FIG. 8.
Figure 10:
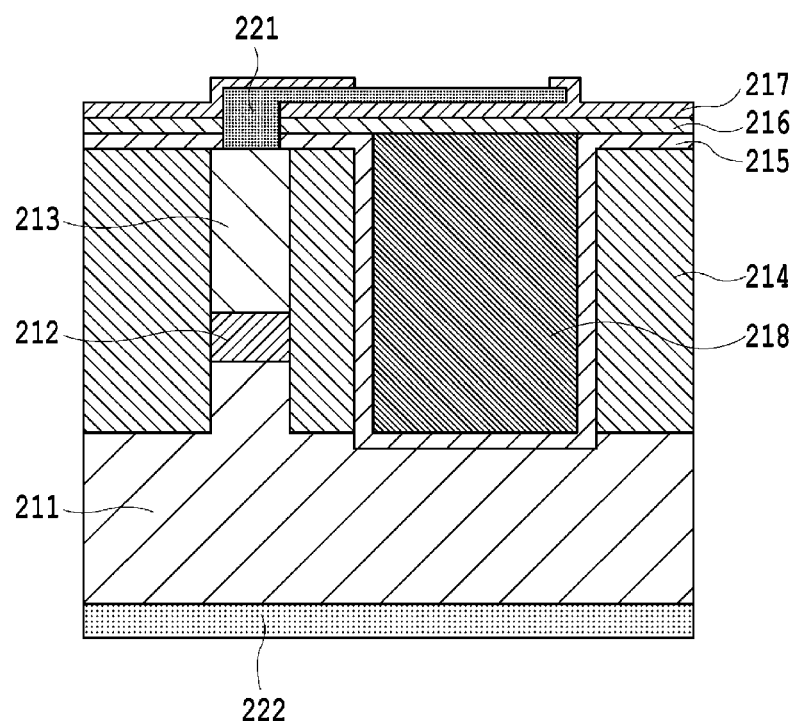
FIG. 10 is a cross-sectional view taken along line X-X of FIG. 8.
Figure 11:
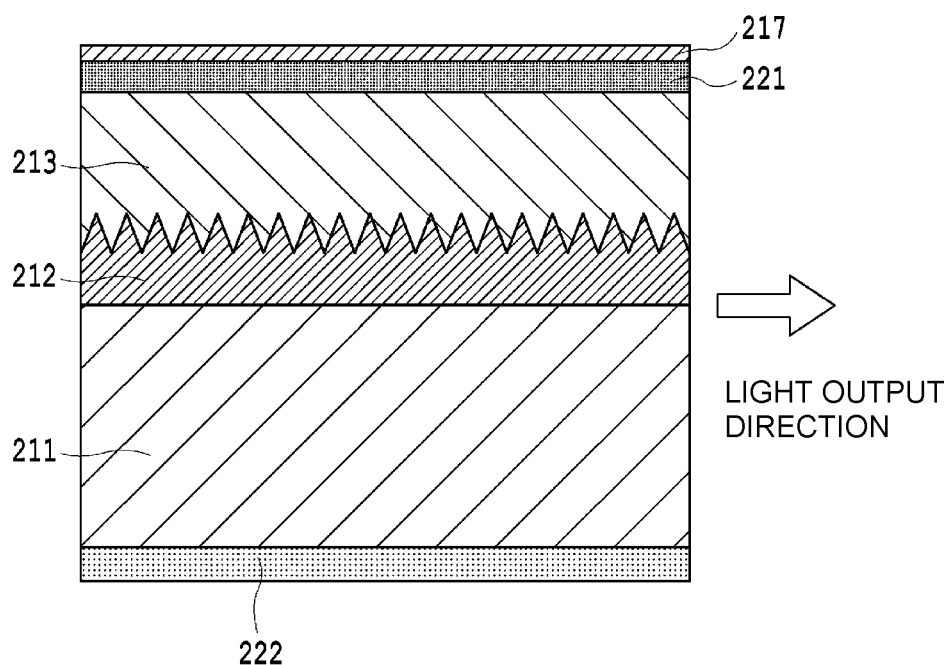
FIG. 11 is a cross-sectional view taken along line XI-XI of FIG. 8.

FIG. 8 shows a top view of a directly modulated DFB laser (directly modulated laser: DML) according to a second embodiment of the present invention. In addition, FIG. 9 shows a cross-sectional view taken along line IX-IX of FIG. 8, FIG. 10 shows a cross-sectional view taken along line X-X of FIG. 8, and FIG. 11 shows a cross-sectional view taken along line XI-XI of FIG. 8. It should be noted that in FIG. 8, the insulation film 217 shown in FIGS. 9 to 11 is not shown for the sake of convenience.

As shown in FIGS. 9 and 11, in the DML, a lower cladding layer 211, a core layer 212, and an upper cladding layer 213 are stacked in order, the layers are etched to form a ridge-type waveguide, and side cladding layers 214 are formed on both sides of the waveguide. A portion below the pad portion of a front electrode 221 is etched, and after an insulation film 215 is formed on the entire surface, an organic material 218 is embedded. An insulation film 216 is stacked on the entire surface except for the portion of the upper cladding layer 213 on the core layer 212.

The front electrode 221 consists of a portion formed on the upper cladding layer 213 on the core layer 212, and a portion constituting a pad for connecting a wire, formed on the organic material 218 with the insulation film 216 interposed therebetween. In addition, a back electrode 222 is formed on the lower cladding layer 211.

As shown in FIG. 9, the insulation film 217 in a region in which the front electrode 221 is formed only on the core, is formed so as to cover the entire surface of the device, including the front electrode 221.

Meanwhile, as shown in FIG. 10, the insulation film 217 in a region including the pad of the front electrode 221 has an opening at the center of the pad portion of the front electrode 221, with edge portions of the opening also being formed on the front electrode 221.

The core layer 212 is made with an MQW construction, and as shown in FIG. 11, forms a diffraction grating with respect to the propagation direction of the light, and oscillates in a single mode. By modulating the intensity of the injection current to the front electrode 221, the intensity of the light is modulated.

In order to apply a high frequency, an organic material 218 with a low dielectric constant such as benzocyclobutene is embedded below the front electrode 221 as mentioned above, making for a construction that reduces the capacitance component. The organic material 218 has a similar capacitance-reducing effect even when a polyamide is used.

In this way, in the DML according to the second embodiment of the present invention, the adjoining edges of the front electrode 221 and the insulation film 216 are all covered by the insulation film 217 so as not to be exposed to the atmosphere. By covering the cracks that occur in the insulation film 216 in the production process with the insulation film 217 made of $SiO_2$, $SiN_X$, $SiON_X$ or the like, the organic solvent such as acetone or ethanol used in the process can be prevented from seeping in between the insulation film 216 and the organic material 218 through thy: cracks in the insulation film 216.

The effects of the insulation film 217 do not change whether it is made from $SiO_2$, $SiN_X$, or $SiON_X$. This resulted in sufficient strength for wire bonding. In a pull test performed after the wire bonding, no peeling occurred, and a strength of 6 g was achieved in a neck break mode.

REFERENCE SIGNS LIST 101, 103 Multiplexing/demultiplexing unit
102 Modulation and phase shift unit
111, 211 Lower cladding layer
112 Passive layer
113, 213 Upper cladding layer
114 Organic material
115, 116, 118, 215, 216, 217 Insulation film
117, 212 EA layer
121 Phase shift electrode
122 Modulation electrode
123, 222 Back electrode
214 Side cladding layer
221 Front electrode

The invention claimed is:

1. A semiconductor device comprising:
a first insulation film in contact with an organic material embedded in the semiconductor device, the first insulation film surrounding the embedded organic material;
an electrode formed on the first insulation film;
a second insulation film that covers adjoining edges of the electrode and the first insulation film, and has an opening that exposes a portion of the electrode; and
a third insulation film that is disposed between the first and second insulation films.

2. The semiconductor device according to claim 1, wherein the electrode is provided across the organic material and a semiconducting material of the semiconductor device.

3. The semiconductor device according to claim 2, wherein the semiconductor device is a directly modulated semiconductor laser.

4. The semiconductor device according to claim 2, wherein the semiconductor device is a Mach-Zehnder modulator.

5. The semiconductor device according to claim 2, wherein the organic material comprises a polyamide or benzocyclobutene.

6. The semiconductor device according to claim 2, wherein the second insulation film comprises SiO2, SiNX, or SiONX.

7. The semiconductor device according to claim 1, wherein the semiconductor device is a directly modulated semiconductor laser.

8. The semiconductor device according to claim 7, wherein the organic material comprises a polyamide or benzocyclobutene.

9. The semiconductor device according to claim 7, wherein the second insulation film comprises SiO2, SiNX, or SiONX.

10. The semiconductor device according to claim 1, wherein the semiconductor device is a Mach-Zehnder modulator.

11. The semiconductor device according to claim 10, wherein the Mach-Zehnder modulator includes an electroabsorption modulator.

12. The semiconductor device according to claim 11, wherein the organic material comprises a polyamide or benzocyclobutene.

13. The semiconductor device according to claim 11, wherein the second insulation film comprises SiO2, SiNX, or SiONX.

14. The semiconductor device according to claim 10, wherein the organic material comprises a polyamide or benzocyclobutene.

15. The semiconductor device according to claim 10, wherein the second insulation film comprises SiO2, SiNX, or SiONX.

16. The semiconductor device according to claim 1, wherein the organic material comprises a polyamide or benzocyclobutene.

17. The semiconductor device according to claim 16, wherein the second insulation film comprises SiO2, SiNX, or SiONX.

18. The semiconductor device according to claim 1, wherein the second insulation film comprises SiO2, SiNX, or SiONX.

19. A semiconductor device comprising:
a first insulation film in contact with an organic material embedded in the semiconductor device;
an electrode formed on the first insulation film; and
a second insulation film that covers adjoining edges of the electrode and the first insulation film, and has an opening that exposes a portion of the electrode,
wherein the semiconductor device is a Mach-Zehnder modulator, and
wherein the Mach-Zehnder modulator includes an electroabsorption modulator.

* * * * *